(12) United States Patent
Macri et al.

(10) Patent No.: US 8,031,538 B2
(45) Date of Patent: *Oct. 4, 2011

(54) METHOD AND APPARATUS FOR DATA INVERSION IN MEMORY DEVICE

(75) Inventors: Joseph Macri, San Francisco, CA (US);
Olge Drapkin, Richmond Hill (CA);
Grigori Temkine, Markham (CA);
Osamu Nagashima, Hamura (JP)

(73) Assignee: ATI Technologies ULC, Markham, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/492,864

(22) Filed: Jun. 26, 2009

(65) Prior Publication Data

US 2009/0323437 A1   Dec. 31, 2009

Related U.S. Application Data

(63) Continuation of application No. 10/966,246, filed on Oct. 15, 2004, now Pat. No. 7,567,467, which is a continuation of application No. 10/681,014, filed on Oct. 7, 2003, now Pat. No. 6,826,095, which is a continuation of application No. 10/163,785, filed on Jun. 5, 2002, now Pat. No. 6,671,212.

(51) Int. Cl.
*G11C 7/06* (2006.01)

(52) U.S. Cl. .............................. 365/189.07; 365/189.04

(58) Field of Classification Search ............. 365/189.07, 365/189.04, 189.08; 711/167, 202
See application file for complete search history.

(56) References Cited

U.S. PATENT DOCUMENTS

| | | | |
|---|---|---|---|
| 4,667,337 A | 5/1987 | Fletcher |
| 5,167,029 A | 11/1992 | Eikill et al. |
| 5,533,185 A | 7/1996 | Lentz et al. |
| 5,630,106 A | 5/1997 | Ishibashi |
| 5,654,653 A | 8/1997 | Coyle et al. |
| 5,748,902 A | 5/1998 | Dalton et al. |

(Continued)

FOREIGN PATENT DOCUMENTS

EP   1050882 B1   7/2005

(Continued)

OTHER PUBLICATIONS

Japanese Official Action; for Japanese Application No. 2003-129584; dated Feb. 3, 2009; pp. 1-3.

*Primary Examiner* — Anh Phung
(74) *Attorney, Agent, or Firm* — Vedder Price P.C.

(57) ABSTRACT

The present invention is a method of writing information to a synchronous memory device by examining a present word of N bits to be written, where each bit has a high or low value. The present word is compared to a previous word also having N bits to identify the number of bit transitions from a low value to a high value of vice versa. The present bit is inverted when the number of transitions is greater than N/2. To avoid the need for having an extra bit accompany data bytes to indicate the presence or absence of inversion, the present invention takes advantage of a data mask pin that is normally unused during writing operations to carry the inversion bit. Non-inverted data is written directly into the memory device while inverted data is first inverted again before writing to storage locations, so that true data is stored in the memory device.

9 Claims, 7 Drawing Sheets

U.S. PATENT DOCUMENTS

| | | | |
|---|---|---|---|
| 5,781,789 A * | 7/1998 | Narayan | 712/23 |
| 5,890,005 A | 3/1999 | Lindholm | |
| 5,953,272 A | 9/1999 | Powell et al. | |
| 6,026,456 A | 2/2000 | Ilkbahar | |
| 6,046,943 A | 4/2000 | Walker | |
| 6,208,177 B1 | 3/2001 | Knoedl, Jr. | |
| 6,243,779 B1 | 6/2001 | Devanney et al. | |
| 6,314,049 B1 | 11/2001 | Roohparvar | |
| 6,318,707 B1 | 11/2001 | Hara et al. | |
| 6,335,718 B1 | 1/2002 | Hong et al. | |
| 6,553,445 B1 | 4/2003 | Drapkin et al. | |
| 6,671,212 B2 | 12/2003 | Macri et al. | |
| 6,738,792 B1 | 5/2004 | Muthusamy | |
| 6,826,095 B2 | 11/2004 | Macri et al. | |
| 7,567,467 B2 | 7/2009 | Macri et al. | |
| 2001/0013803 A1 | 8/2001 | Bertin et al. | |
| 2002/0144166 A1 | 10/2002 | Chang et al. | |
| 2003/0041223 A1 | 2/2003 | Yeh et al. | |
| 2003/0151424 A1 | 8/2003 | Macri et al. | |

FOREIGN PATENT DOCUMENTS

| | | |
|---|---|---|
| JP | 8314589 A | 11/1996 |
| JP | 9251336 A | 9/1997 |
| JP | 2000099218 A | 4/2000 |
| JP | 2000132964 A | 5/2000 |
| JP | 2001006398 A | 1/2001 |
| JP | 2002093168 A | 3/2002 |

* cited by examiner

METHOD AND APPARATUS FOR DATA INVERSION IN MEMORY DEVICE

CROSS-REFERENCE TO RELATED COPENDING APPLICATIONS

This application is a continuation of U.S. patent application Ser. No. 10/966,246, filed Oct. 15, 2004, entitled Method and Apparatus for Data Inversion in Memory Device, now U.S. Pat. No. 7,567,467, issued on Jul. 28, 2009, which is a continuation of U.S. patent application Ser. No. 10/681,014, filed Oct. 7, 2003, now U.S. Pat. No. 6,826,095, issued on Nov. 30, 2004, which is a continuation of U.S. patent application Ser. No. 10/163,785, filed Jun. 5, 2002, now U.S. Pat. No. 6,671,212, issued on Dec. 30, 2003, having as inventors Joseph Macri et al., owned by instant assignee and incorporated herein by reference in their entireties.

BACKGROUND OF THE INVENTION

1. Field of the Invention

The present invention relates to the field of data writing and reading.

2. Background Art

Digital data is stored in memory devices as ones and zeros. Data is transferred into and out of a memory device via a conductive path called a "pin". Data is written into the memory as a string of high and low signals that represent the ones and zeros. Each time there is a transition between the low and high signals, the efficiency of the memory device is reduced. However, because data is somewhat random, there is no easy way to control the data to reduce the number of transitions. This problem can be understood by a review of writing to and from memory devices.

FIG. 1 is a block diagram of a data source and a data receiver. The data source 100 communicates with the data receiver 102 via a bus 101. Data is transferred in blocks of 8 bits called "bytes". Each byte is sent to the data receiver 102 in parallel as 8 data signals on 8 lines with each signal line being high or low depending on the data being transmitted. For example, if a data value of one is sent, the bus line is at a high state. If the next signal sent is a zero, the bus line must be brought down to a low state to represent the new data. Then, if the succeeding signal is a one, the bus line must be again brought up to the high value. These changes of state are known as data transitions and require time and energy to achieve. Consider the following scenario, representing four bytes of data that are written to the data receiver 102.

| Data Byte | # of Transitions |
|---|---|
| 00000000 | — |
| 11111111 | 8 |
| 10001000 | 6 |
| 01110111 | 6 |

The total number of data transitions in the 24 bits of bytes 2, 3, and 4 in the above example is 20, or 83%. (Note that this assumes that each line of the bus was in a low state when the original byte is sent). This results in time and power penalties in the operation of the data transfer system.

Data Inversion Scheme

The prior art has provided a scheme to reduce the number of data transitions in writing to a memory device known as "data inversion". In the data inversion scheme, the number of data transitions between one byte and the next is determined and analyzed. If the number of transitions is greater than four, the data of the byte to be sent is inverted. In this way the number of transitions is made to be less than four. This scheme sets a bound of four on the greatest number of transitions that can occur from byte to byte, for a maximum of 50% transitions. The operation of the data inversion scheme is illustrated by reference to the table below.

| Data Byte | Invert? | Data Byte Actually Sent | # of Transitions |
|---|---|---|---|
| 00000000 | — | 00000000 | — |
| 11111111 | Yes | 00000000 | 0 |
| 10001000 | No | 10001000 | 2 |
| 01110111 | Yes | 10001000 | 0 |

After the first byte is sent, the next byte is examined to see how many transitions there would be if the byte was sent without inversion. Here, where the byte changes from all zeros to all ones, there would be 8 transitions. Since 8 is greater than four, the byte is inverted, becoming all zeros. When this byte is sent, there are no data transitions, since each line of the bus was already in the low state. Examining the next byte, it is compared to the actual byte sent (in this case the inverted byte) to determine the number of possible transitions. Without inversion, there will be two transitions, which is less than four, so the byte is sent without inversion. Comparing the next byte (01110111) to the byte that had been sent reveals 8 transitions if it is sent without inversion. Therefore the byte is inverted (to 10001000) and is sent with no transitions. Sending the same data using the inversion scheme results in only 2 transitions out of 24 bytes, or 8.3%. This improvement results in better and faster data transfer operation.

A disadvantage of the data inversion scheme is that it requires an extra bits to be sent with the data byte so that the data can be properly used or stored at the data receiver, as well as extra bits when data is read from the receiver. These extra bits require additional wiring for the bus, data sender and receiver, adding to the expense and complexity of a system.

SUMMARY OF THE INVENTION

The present invention is a method of writing information to a synchronous memory device by examining a present word of N bits to be written, where each bit has a high or low value. The present word is compared to a previous word also having N bits to identify the number of bit transitions from a low value to a high value of vice versa. The present bit is inverted when the number of transitions is greater than N/2. To avoid the need for having an extra bit accompany data bytes to indicate the presence or absence of inversion, the present invention takes advantage of a data mask pin that is normally unused during reading operations to carry the inversion bit. Non-inverted data is written directly into the memory device while inverted data is first inverted again before writing to storage locations, so that true data is stored in the memory device.

DETAILED DESCRIPTION OF THE INVENTION

The present invention is a method and apparatus for reading and writing data. In the following description, numerous specific details are set forth to provide a more thorough description of embodiments of the invention. It is apparent, however, to one skilled in the art, that the invention may be practiced without these specific details. In other instances, well known features have not been described in detail so as not to obscure the invention.

Currently there has not been provided an efficient scheme for using data inversion in a dynamic random access memory (DRAM) system. One of the advantage of using DRAMs in a system is the low cost of DRAMs and the commodity nature of such memory devices. A DRAM communicates with other devices via "pins" that extend from the DRAM package. If a DRAM using a data inversion scheme requires extra pins for the inversion information, the DRAM might not be usable in many applications where the geography is for DRAMS having fewer pins. Similarly, the expense of building and selling a DRAM with an extra pin could make it commercially unviable.

The present invention takes advantage of an existing pin called the data mask (DM) pin that is associated with the data pins of a DRAM. The DM pin is typically used on data input but not on data output. The invention takes advantage of the DM pin on data output to provide a signal indicating the presence or absence of data inversion when the data is being outputted by the DRAM.

In the DRAM of the preferred embodiment of the invention, there are 32 data bits DQ0 to DQ31 divided into four bytes each DQ0-DQ7, DQ8-DQ15, DQ16-DQ23, and DQ24-DQ31. Each of the data bytes has an associated data mask pin DM0-DM3 that is used during write operations to mask the data input as appropriate. When any of DM1 to DM3 are high, the data input at the same timing are masked.

Write Operations

Figure 1:
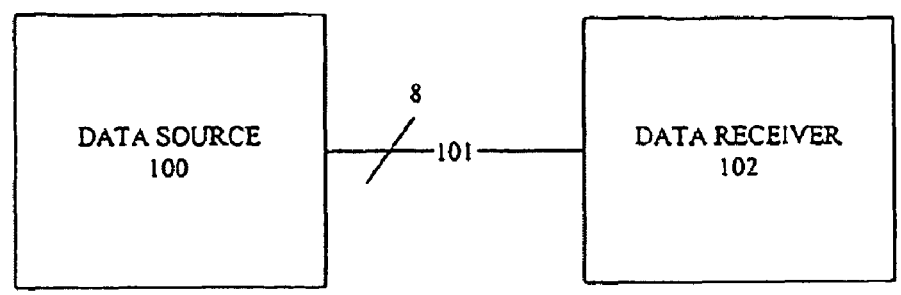
FIG. 1 is a block diagram of a data source and a data receiver.
Figure 2:
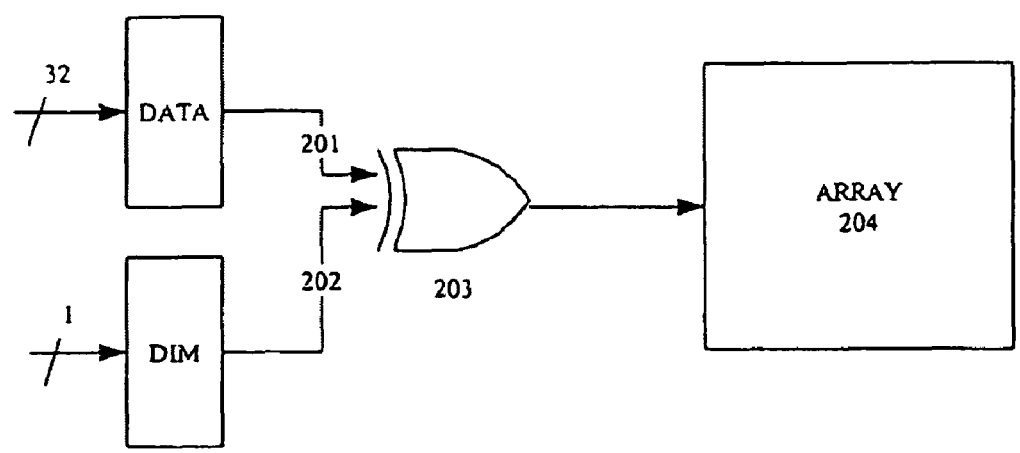
FIG. 2 is a diagram of an implementation for writing data to a device.

Write operations to the DRAM must include an indication of whether the incoming data is inverted or not inverted. A data inversion mask (DIM) bit is included with the data to be written so that the DRAM can store the data in its true state. One implementation for accomplishing this is illustrated in FIG. 2. Incoming data is provided as input 201 to an exclusive OR gate 203, along with DIM bit 202. When the DIM bit is high, the data coming in has been inverted so it is re-inverted via XOR gate 203 before being stored in the data array 204.

Read Operations

Figure 3:
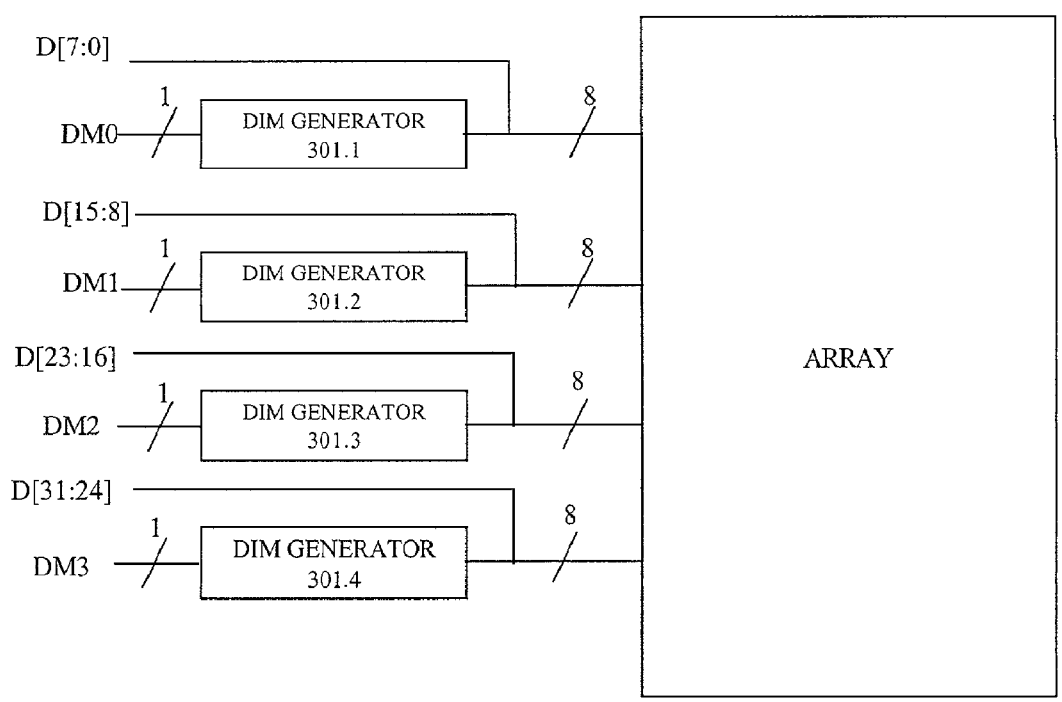
FIG. 3 illustrates read circuitry for the DRAM of the present invention.

FIG. 3 illustrates read circuitry for the DRAM of the present invention. Each byte of data has an associated DM pin. For example, data byte D[7:0] is associated with DM0, byte D[15:8] is associated with DM1, byte [23:16] is associated with DM2, and byte D[31:24] is associated with DM3. During read operations, the data is provided from array 300 directly to the data output pins and to a DIM generator such as generators 301.1 through 301.4. The DIM generator determines of the data should be inverted or not to reduce data transitions during the read operation. The output of the DIM generator is outputted on the DM pin associated with the data byte.

Figure 4:
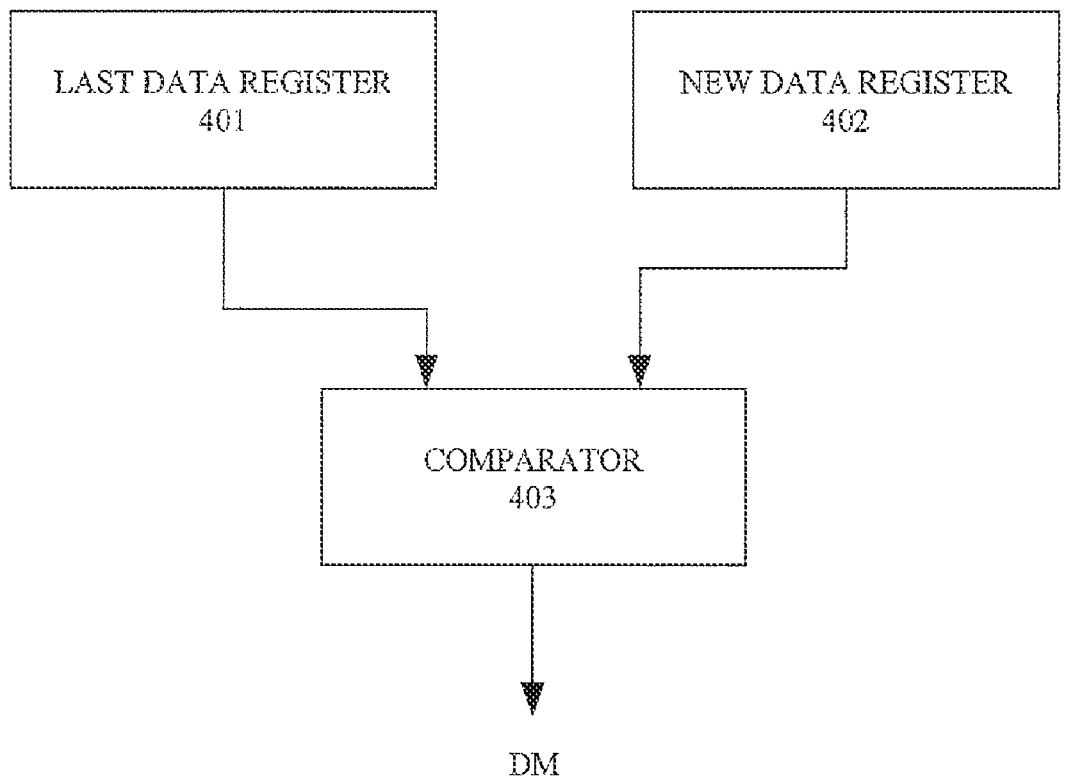
FIG. 4 is an example of a DIM generator.

An example of a DIM generator is illustrated in FIG. 4. A last data register 401 stores the most recently sent byte (as it was actually sent, inverted or non inverted). A new data register 402 stores the current data byte to be sent. The outputs of registers 401 and 402 are provided to comparator 403. If the number of transitions is greater than 4 bits, the comparator 403 outputs a high signal to be output on the DM pin with the data byte.

Burst Operation

Figure 5:
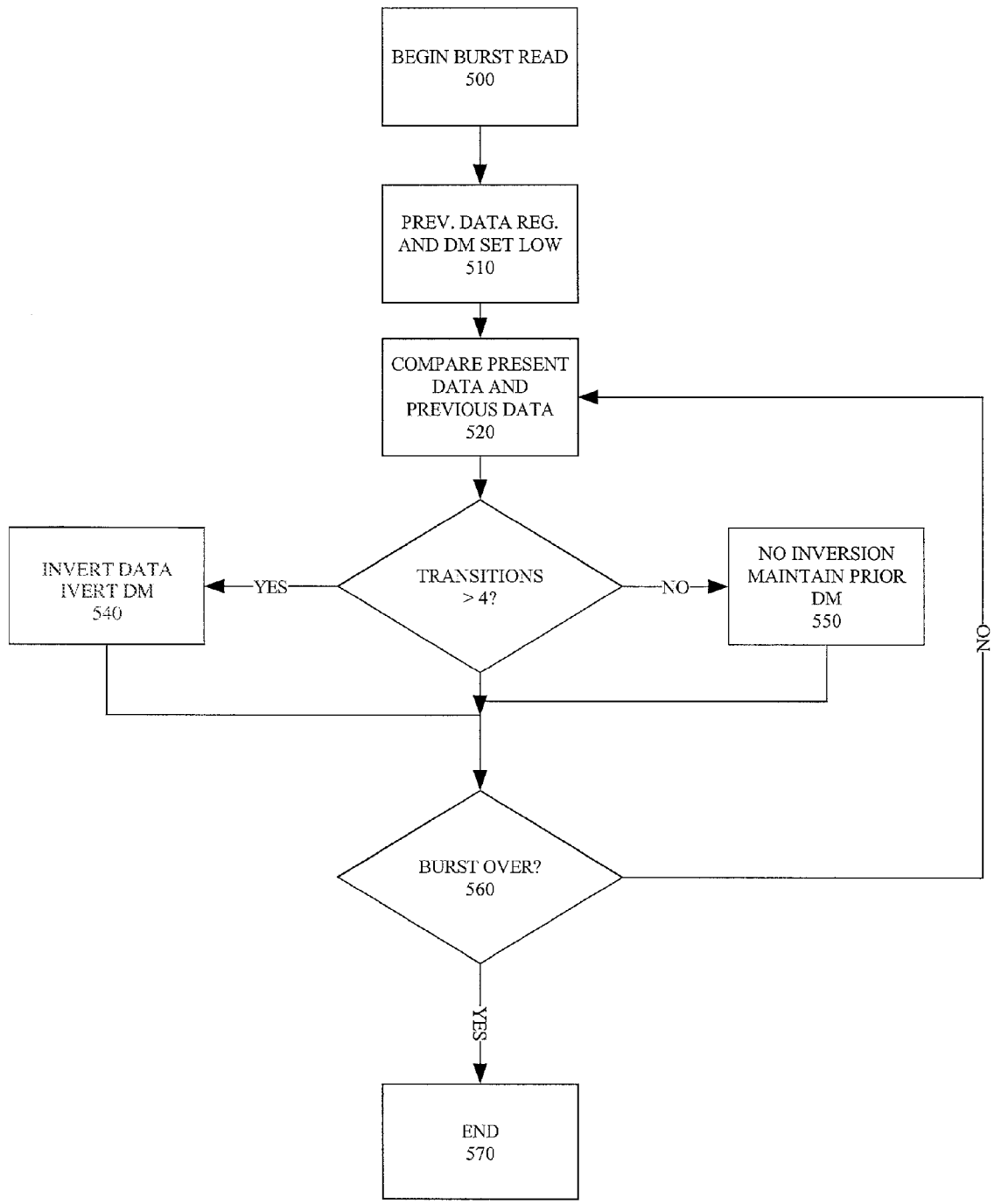
FIG. 5 is a flow diagram that illustrates the operation of the invention during a burst read operation.

Often reads are done from a DRAM in a burst mode. FIG. 5 is a flow diagram that illustrates the operation of the invention during a burst read operation. At block 500 the burst read begins. At block 510 the previous data register and the DM signal are set to low. At block 520 the present data and previous data are compared to determine the number of transitions that will occur when sending the present data. At decision block 530 the number of transitions is checked to see if it is greater than 4. If yes, the data is inverted and the DM is inverted at block 540. If the result at decision block 530 is no, the data is not inverted and the previous DM value is maintained at block 550.

After either of block 540 or 550, a determination is made at decision block 560 as to whether the burst operation has ended. If yes, the process ends at block 570. If no, the present data is stored in the prior data register, the new data byte is obtained, and the process returns to block 520.

Pin Advantages

The present invention has the advantage of providing the ability to provide data inversion for a DRAM without the need for excessive increased pin count, especially for read operations. By using the a pin that is normally unused during read operations, i.e. the DM pin, the invention permits byte reads using data inversion with no additional pins for the read operation.

Termination

As described above with respect to the burst read example, an assumption was made that the bus was in a low state when the burst read operation began. This is not required and the invention is not limited to such a scheme or assumption. The termination of the bus can be any one of a number of ways as described below.

A. Pulled Low—In one embodiment of the invention, the bus is gradually pulled low after reads. One method of accomplishing this is described in a co-pending patent application entitled "Self-Termination Scheme In A Double Data Rate Synchronous Dynamic Random Memory Device", assigned to the assignee of the present invention, and filed on Jun. 5, 2002, Ser. No. 10/164,044, which in turn is based on Provisional Application, "Self Termination Scheme In A Double Data Rate Synchronous Dynamic Random Memory Device", filed on Feb. 8, 2002, Ser. No. 60/355,288. In this scheme, NMOS transistors are coupled to the bus lines and gradually pull them to ground over some period of time. When this scheme is used, a read operation is assumed to begin with all lines low and the number of transitions for the first byte of data is determined based on this assumption.

B. Pulled High—In another embodiment, the bus can be pulled high be a PMOS termination scheme so that over time, after activity on the bus, all lines are pulled to a high state. The assumption in this scheme is that all lines are high at the beginning of a read operation and therefore the number of transitions for the first byte is determined with respect to an all high state.

C. Midpoint Termination—In an alternative embodiment, the bus lines are pulled to a midlevel condition over time. When this scheme is used, the first byte in a read operation is sent non-inverted since there will be no difference in pulling the bus lines high or low from the midlevel state.

D. Unterminated Unlatched—In this embodiment, the bus lines are not terminated at all and a first data byte is always sent unterminated. This results in lost efficiency for the first byte, since it may be possible to have greater than four transitions for the first byte.

E. Unterminated Latched—This embodiment leaves the bus lines in the same state as the most recent byte on the bus and latches that value. For a subsequent operation, the previous byte register contains the latched value and the first byte is compared to that latched value to determine the number of transitions.

Processor Interface Logic Application

Figure 6:
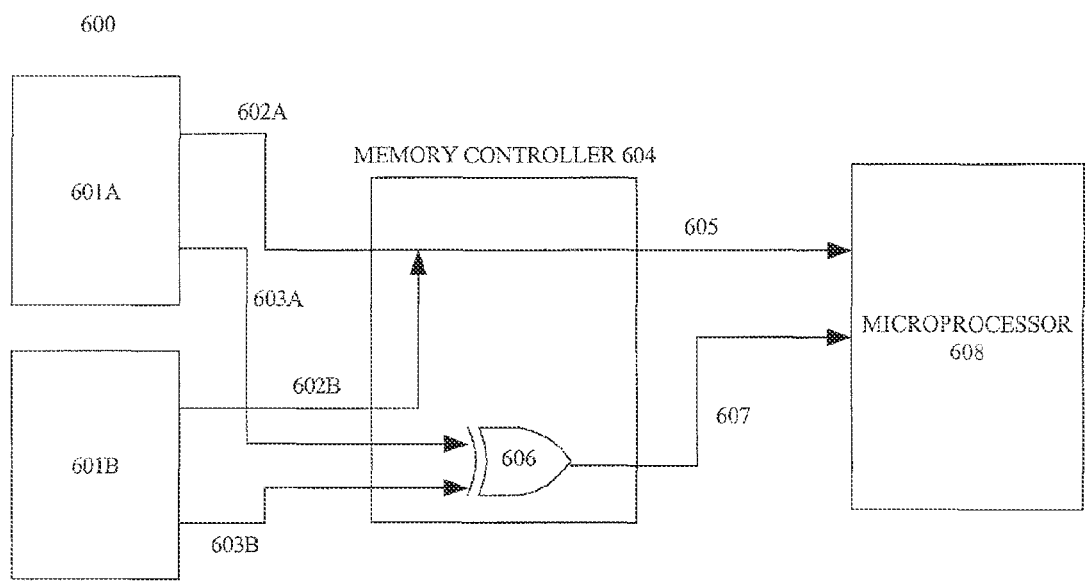
FIG. 6 is a block diagram of the invention used with a microprocessor interface.

Although described in connection with a DRAM, the present invention has other applications as well. For instance, the scheme can be used in connection with a microprocessor interface logic to allow a data inversion scheme to be used. An example of such an embodiment is illustrated in FIG. 6.

A DRAM 601 includes, for example first and second data banks 601A and 601B each having an output bus 602A and 602B along with associated DIM signals 603A and 603B (note that the DIM signals could be provided on DM pins). The outputs of the DRAM are provided to memory controller 604. Within the memory controller 604 the data outputs 602A and 602B of the DRAM are combined in a 16 bit bus 605 to microprocessor 608. The DIM signals 603A and 603B are coupled as inputs to an XOR gate 606 to produce an output signal 607 to microprocessor 608.

Power Optimization

Figure 7A:
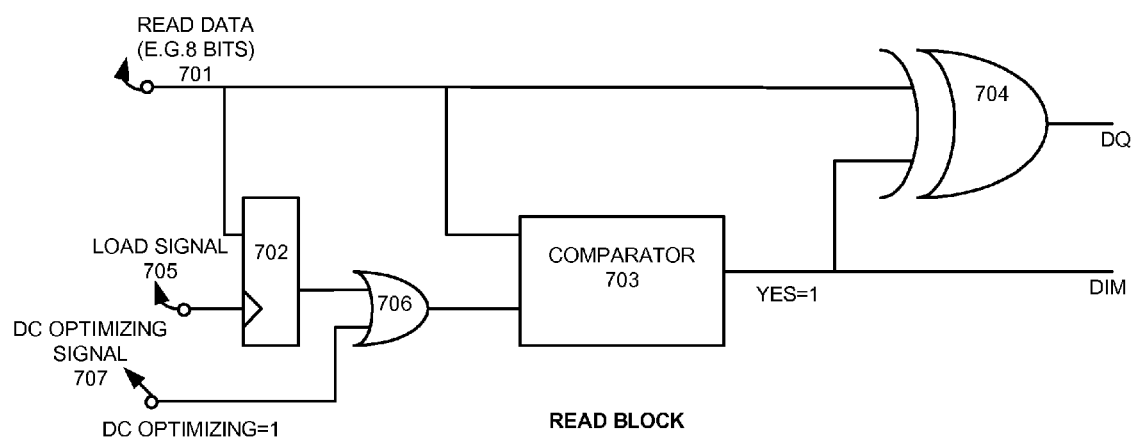
FIG. 7A is a block diagram of an alternate embodiment of a read block of the present invention.

An embodiment of a read block of the present invention is illustrated in FIG. 7A. This embodiment provides DC power optimization when the I/O is open drain (i.e. the bus is terminated to a logical 1). Referring to FIG. 7A, read data 701 (8 bits) is coupled to flip-flop 702, comparator 703, and NOR gate 704. A load signal 705 is coupled to the enable input of flip-flop 702. The output of flip-flop 702 is coupled to one input of OR gate 706 along with DC optimizing signal 707. The DC optimizing signal is a logical 1 which is OR'ed into the previous data field of the comparator block 703. This OR'ing guarantees that the output of the comparator will have more than half of its values being a logical 1, saving DC power. The comparator 703 compares the present data field with the previous data field to see if there are more than 4 bits with different values. If so, the output (DIM) is a logical 1 and is provided to NOR gate 704 and appropriate inversion of the data is provided.

If the bus is terminated to a logical 0, then the DC optimizing signal can be a logical 0 as well, so that more than half of the outputs are biased to 0, also saving power.

Figure 7B:
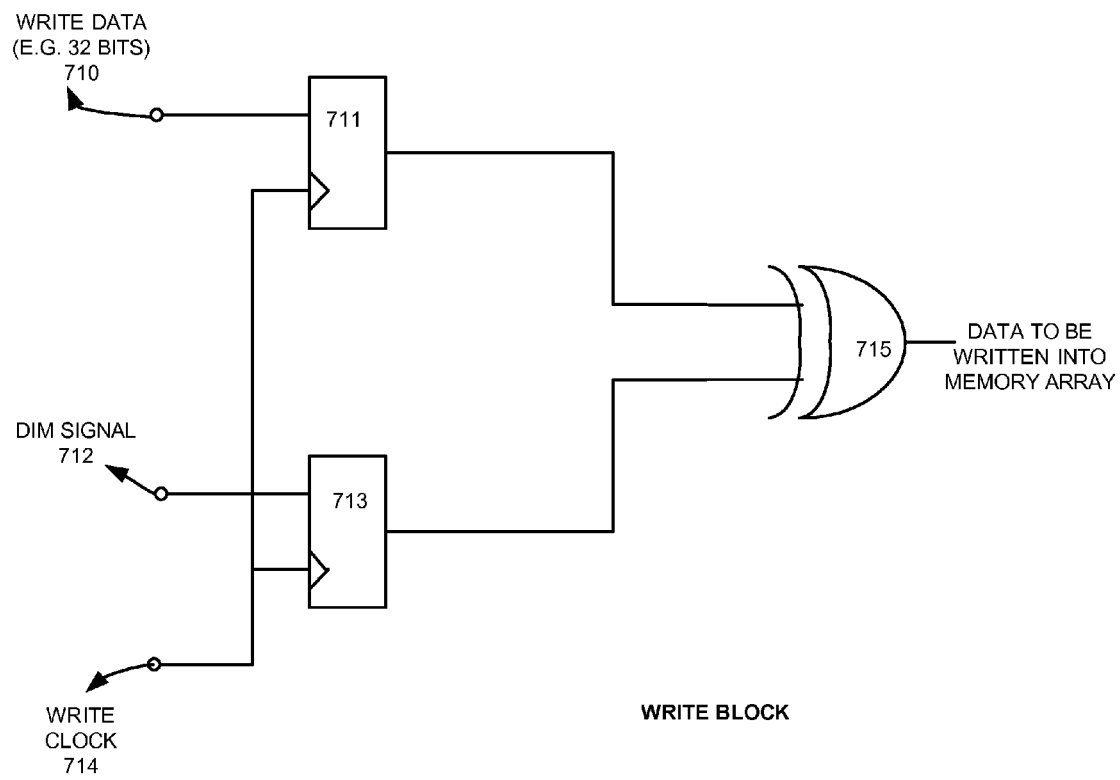
FIG. 7B is an alternate embodiment of a write block of the present invention.

Referring now to FIG. 7B, a block diagram of a write block is shown. Write data 710 (e.g. 32 bits) is provided to flip-flop 711 and a DIM signal 712 is provided to flip-flop 713. Both flip-flops are clocked with Write clock signal 714. The outputs are coupled as inputs to NOR gate 715 to produce the data to be written into the memory array.

The present invention has been described in terms of the transmission of data but has equal application to any digital signals including address or command signals.

Thus, a method and apparatus for data inversion in memory devices has been described.

What is claimed is:

1. An apparatus comprising:
   a memory device comprising:
      a data array that is operative to store a first set of bits and a second set of bits; and
      a data inversion mask generator that is operative to selectively provide bit inversion information based on the first set of bits and the second set of bits; and
   a memory controller, operatively coupled to the memory device, that is operative to provide output data based on the first set of bits and output inversion information based on the bit inversion information.

2. The apparatus of claim 1, further comprising a processor that is operative to process the output data based on the output inversion information.

3. The apparatus of claim 1, wherein:
   the memory device is operative to store a third set of bits and a fourth set of bits; and
   the data inversion mask generator that is operative to selectively provide second bit inversion information based the third set of bits and the fourth set of bits.

4. The apparatus of claim 3, wherein the memory controller comprises an XOR gate that is operative to provide the output inversion information in response to the bit inversion information and the second bit inversion information.

5. The apparatus of claim 3, wherein the memory controller is operative to provide the output data based on the third set of bits.

6. A memory device comprising:
   a data bus operatively coupled to an input of a flip-flop, a first input of a comparator, and a first input of a logic gate;
   an enable input of the flip-flop operative to receive a load signal;
   an output of the flip-flop operatively coupled to a first input of an OR gate;
   a second input of the OR gate operative to receive a DC optimizing signal;
   an output of the OR gate operatively coupled to a second input of the comparator;
   an output of the comparator operatively coupled to a data inversion mask bit and to a second input of the logic gate; and
   an output of the logic gate operatively coupled to an I/O pin.

7. The memory device of claim 6, wherein the logic gate is one of a NOR gate and an XOR gate.

8. A memory device comprising:
   a write data bus operatively coupled to an input of a first flip-flop;
   an input of a second flip-flop operative to receive a data inversion mask;
   an enable input of each of the first flip-flop and the second flip-flop operative to receive a write clock signal;
   an output of the first flip-flop connected to a first input of a logic gate;
   an output of the second flip-flop connected to a second input of the logic gate; and
   an output of the logic gate connected to an I/O pin.

9. The memory device of claim 8, wherein the logic gate is one of a NOR gate and an XOR gate.

* * * * *